United States Patent [19]
Magel et al.

[11] Patent Number: 5,171,400
[45] Date of Patent: Dec. 15, 1992

[54] METHOD OF PRODUCING CRYSTALLINE RODS HAVING REGIONS OF REVERSED DOMINANT FERROELECTRIC POLARITY AND METHOD FOR CLARIFYING SUCH A ROD

[75] Inventors: Gregory A. Magel, Palo Alto; Martin M. Fejer, Menlo Park; Robert L. Byer, Stanford, all of Calif.

[73] Assignee: Stanford University, Stanford, Calif.

[21] Appl. No.: 735,158

[22] Filed: Jul. 23, 1991

Related U.S. Application Data

[63] Continuation of Ser. No. 442,978, Nov. 29, 1989, abandoned.

[51] Int. Cl.[5] .................................................. C30B 1/10
[52] U.S. Cl. .................................. 156/603; 156/600; 156/620.72; 156/DIG. 71; 156/DIG. 73; 156/DIG. 87
[58] Field of Search ................. 156/620.72, 620.73, 156/620.74, 620.75, 600, 603, DIG. 73, DIG. 71, DIG. 87

[56] References Cited

U.S. PATENT DOCUMENTS

| | | | |
|---|---|---|---|
| 3,446,603 | 5/1969 | Loiacono et al. | 156/DIG. 87 |
| 3,607,752 | 9/1971 | Graenicher | 156/DIG. 87 |
| 4,623,423 | 11/1986 | Aubert et al. | 156/DIG. 71 |
| 4,640,736 | 2/1987 | Holman | 156/DIG. 71 |

FOREIGN PATENT DOCUMENTS 60-195098 10/1985 Japan ........................ 156/DIG. 71

OTHER PUBLICATIONS

Holman et al., "Chemical Control of Optical Damage in Lithium Niobate" Applied Physics Letters 32(5) Mar. 1, 1978 pp. 280-283.

Primary Examiner—Robert Kunemund
Attorney, Agent, or Firm—Flehr, Hohbach, Test, Albritton & Herbert

[57] ABSTRACT

A method of growing a single crystal rod with regions of reversed dominant ferroelectric polarities (poling the same) is described. It is a variation of laser-heated pedestal growth. The microscopic growth rate of the crystal is modulated to incorporate into the rod, the compositional melt gradient which is formed at the freezing interface. When this gradient is of the proper sign and the poling action due to it is of sufficient strength to overcome the normal poling action with which the rod would otherwise grow, it defines a reversed domain region. This region is reduced in temperature to below the Curie temperature before the gradient responsible for the same can diffuse. A method of clarifying a single crystal to make the same transparent to optical radiation of interest is also described.

2 Claims, 3 Drawing Sheets

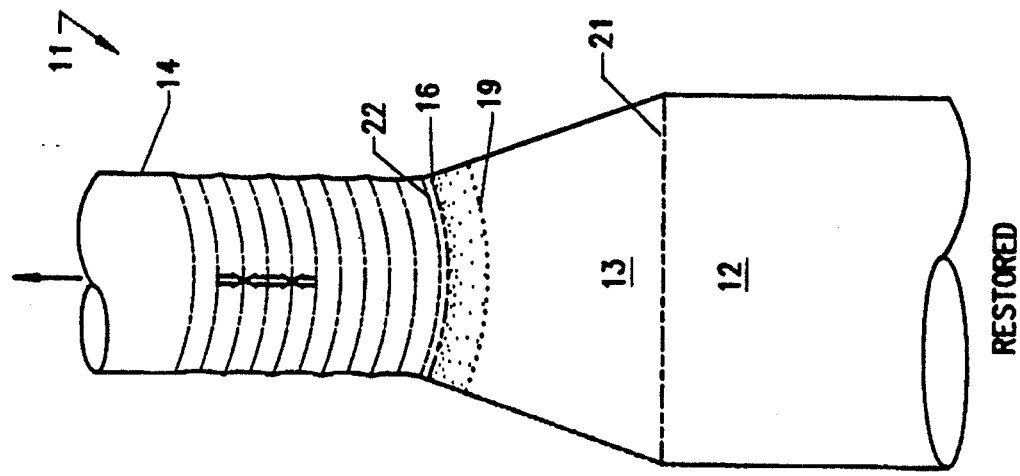
FIG. 1C RESTORED
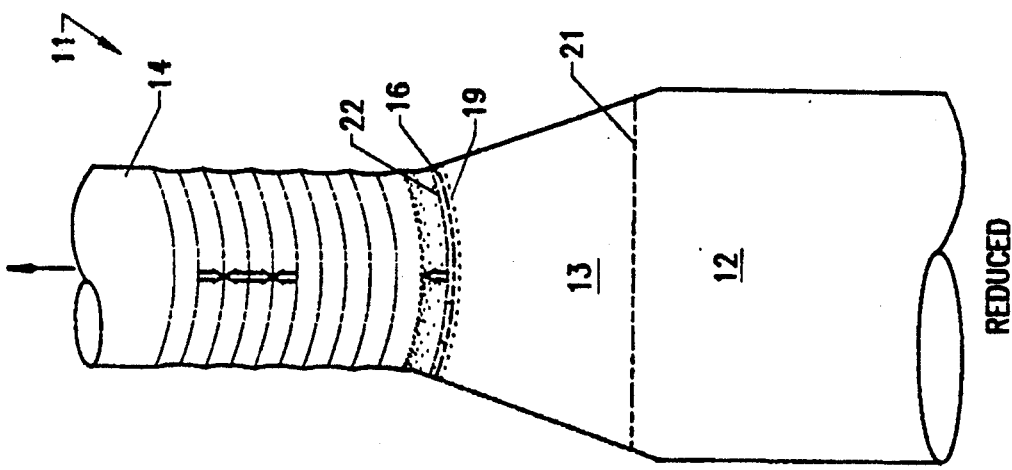
FIG. 1B REDUCED
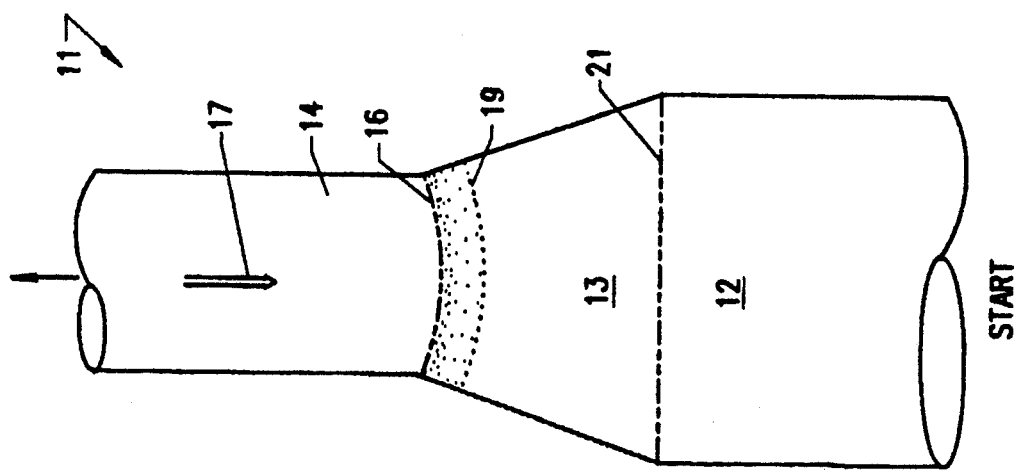
FIG. 1A START

METHOD OF PRODUCING CRYSTALLINE RODS HAVING REGIONS OF REVERSED DOMINANT FERROELECTRIC POLARITY AND METHOD FOR CLARIFYING SUCH A ROD

U.S. GOVERNMENT CONTRACTS AND GRANTS

This invention was conceived or made at least partially with government support, and the U.S. Government has certain rights to the invention.

This is a continuation of application Ser. No. 07/442,978 filed Nov. 29, 1989, now abandoned.

BACKGROUND OF THE INVENTION

The present invention relates to a method of poling a ferroelectric crystalline body. It also relates to a method of clarifying the transparency of a ferroelectric crystalline body.

Significant uses are being found for ferroelectric crystalline bodies having regions of differing ferroelectric domains. For example, bodies having sequential and adjacent regions differing of are being used to obtain second harmonic generation (SHG) of optical radiation via quasi-phase-matching. The present invention enables the production of such a body which implements quasi-phase-matching as described in Bloembergen U.S. Pat. No. 3,384,433 in a superior way. (As used herein, the terminology "optical radiation" means electromagnetic radiation in the visible wavelength spectrum and in other adjacent wavelength spectrums—typically radiation having a wavelength in the range of between 100 and 100,000 nanometers). Radiation having a wavelength of about 0.43 micrometers (blue light) is achieved from 0.86 radiation obtained typically from a GaAlAs diode laser, by quasi-phase-matched second harmonic generation in a periodically polled crystalline body. This wavelength of radiation is particularly valuable for optical storage and other uses.

Patent application Ser. No. 07/305,215 filed Feb. 1, 1989 for NONLINEAR OPTICAL RADIATION GENERATOR AND METHOD OF CONTROLLING REGIONS OF FERROELECTRIC POLARIZATION DOMAINS IN SOLID STATE BODIES, naming two of the inventors hereof, describes methods applicable to achieving reversed polarization in existing ferroelectric crystalline bodies having dominant polarities. One approach described in such application is the patterned introduction of selected dopant materials into a solid state, ferroelectric crystalline body. Another approach that is described is to apply electric fields to an existing solid state body having a dominant polarity. The procedure of creating regions of different dominant polarities is referred to in the art as "poling".

SUMMARY OF THE INVENTION

The present invention relates to a method of forming a ferroelectric crystalline body with regions of differing ferroelectric polarities. A significant advantage of this method over those described in the patent application identified above is that it is applicable to poling at the time a ferroelectric crystalline body is being formed, whereas the methods described in such patent application are designed for poling a ferroelectric crystalline body after it has been formed. Moreover, the process of the instant invention provides desired domains for the full width of a body. With the method of the instant invention the domains can be made in the material with high spatial frequency along the crystal growth direction, either periodically or aperiodically.

From the broad standpoint, the invention comprises modulating the composition of the molten material at a freezing interface formed during a process which is akin to laser-heated pedestal growth (LHPG) of small-diameter crystals. That is, a ferroelectric crystalline seed is dipped in a molten zone or volume of a source rod of the material. Such seed is withdrawn from the molten zone, while the source rod is fed toward the same molten zone so that as the seed is withdrawn, a ferroelectric crystalline body is formed at a freezing interface. Most desirably, the body is formed under growth conditions which will provide the same with a natural dominant ferroelectric polarity. During growth, in general a boundary layer is formed in the molten zone adjacent to the freezing interface having a different composition than the crystalline body. This different composition is one which if incorporated into the body will provide a composition gradient in such body which will define a desired polarity. If the body is formed with a natural dominant polarity, this desired polarity most desirably is the opposite dominant polarity. (As used herein, the term "differing" polarity encompasses random polarity as well as dominant polarities.)

In keeping with the invention, the location of the freezing interface or line relative to the body being grown is changed to capture in the rod, the composition at the boundary. This will result in the desired composition gradient being incorporated into the body. The region so formed in the body is passed through its Curie temperature before it has a chance to diffuse to such an extent it will no longer provide a desired polarity in the body. The invention also includes a method of clarifying a body of ferroelectric crystalline material, such as a lithium niobate (LiNbO$_3$) rod having a dopant or component defining a polarity which is different than that of the base material.

The polarity mentioned above can be defined by a dopant that has been provided as part of the source rod or by making the source rod (or the molten volume directly) of an incongruently melting composition. For example, if the crystal that is being grown is a lithium niobate crystal, the melt can contain more or less lithium than would exist in a congruent melt. However, a major feature of the instant invention is that it enables a poled lithium niobate crystal to be formed from a near congruent composition of lithium.

It should be noted that the broad concept of producing a ferroelectric crystalline body with opposite ferroelectric domain structures is not new. The 1982 paper entitled "The Growth striations and ferroelectric domain structures in Czochralski-grown LiNbO$_3$ single crystals" authored by Ming, et al. and appearing on pages 1663–1670 of *The Journal of Materials Science* (Vol. *17*), describes an experiment in which such domains were formed during growth of a ferroelectric crystalline body by the Czochralski process. Periodic domain structures also have been created in lithium niobate using the Stepanov growth technique. See, for example, the Russian paper starting on page 386 volume 47 of *Izv. Akad. Nauk SSSR.* by B. S. Red'kin, et al., the B. S.. Red'kin, et al. paper on page 2412 (1985) of volume 49 of the same publication; and the B. S. Red'kin, et al. paper starting on page 106 of volume 82 of the *Journal of Crystal Growth.* Both the Czochralski and the Stepanov growth processes, though, are so complex that it is not clear that only modulation of the growth rate of a body having a dominant polarity, may be used to achieve domain reversals. Moreover, one cannot obtain with either of these processes sufficient control over domain structure to obtain small periods.

BRIEF DESCRIPTION OF THE DRAWINGS

With reference to the accompanying three sheets of drawing:

FIGS. 1A-1C are schematic illustrations showing a time sequence of the formation of a single reversed domain in a laser-heated pedestal growth arrangement;

DETAILED DESCRIPTION OF THE PREFERRED EMBODIMENTS

Figure 2:
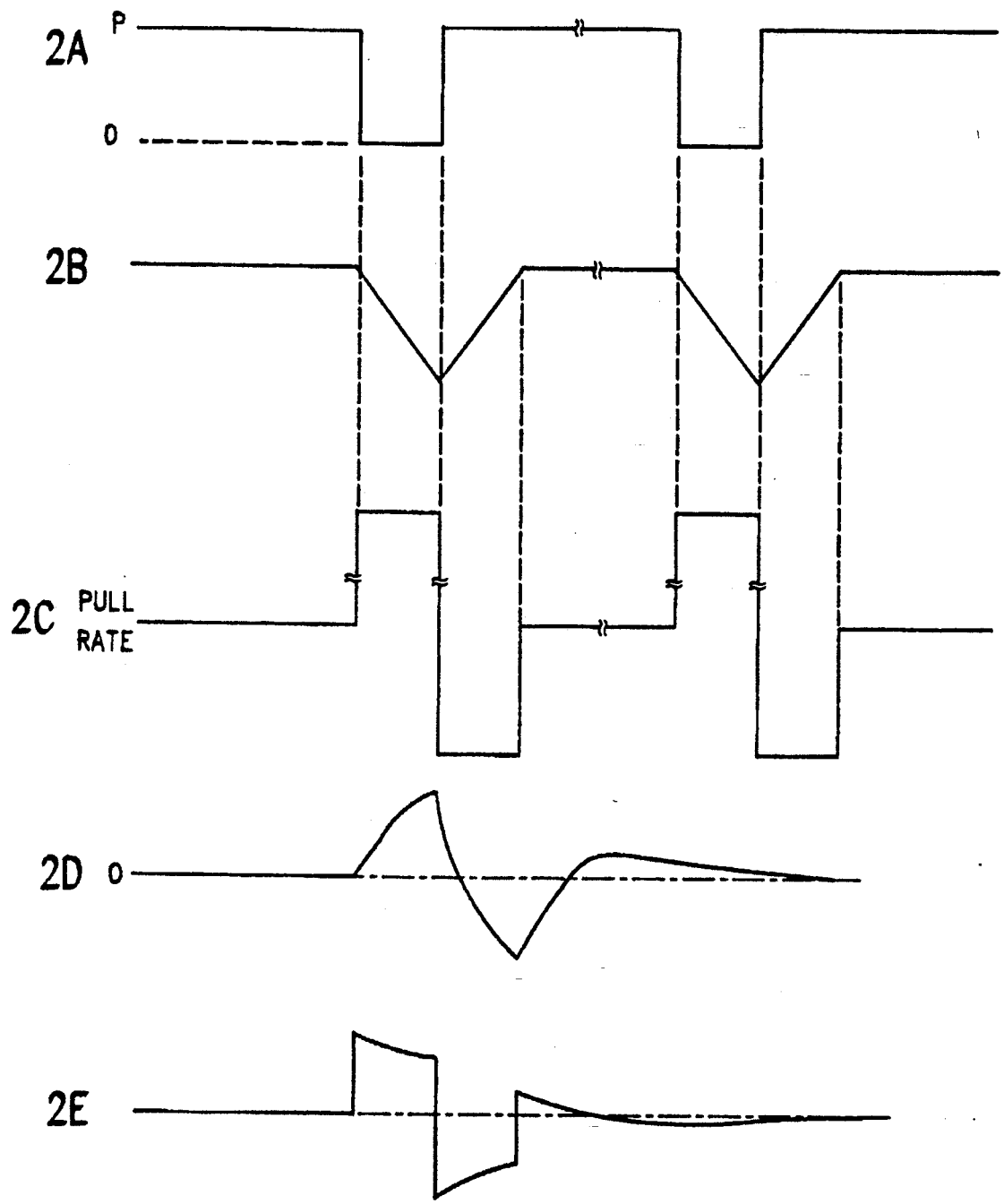
FIGS. 2A-2E are five graphical representations of heat input and resultant rod growth and boundary layer characteristics.

A preferred embodiment of an arrangement for the growth of small-diameter crystals is generally referred to by the reference numeral 11 in FIGS. 1A-1C. This arrangement is basically akin to a laser-heated pedestal growth (LHPG) arrangement. Optical radiation from a laser (not shown) is focused on the tip of a source rod 12 of a material from which a desired ferroelectric crystalline body in the form of a rod is to be formed.

The laser output is selected to provide sufficient thermal energy to melt the tip to form a molten volume, as schematically represented at 13 in FIG. 1. Pains are taken to uniformly heat the source rod with good rotational symmetry (the laser beam should be uniform all the way around the melt). However, it should be noted that the laser heat source could be replaced by another radiation source such as a focused xenon lamp or a heated wire source, without changing the nature of the invention.

In an implementation of the instant invention, the source rod was selected to be lithium niobate as the base material, doped with approximately 5% by atomic weight of magnesium. The heat source was a $CO_2$ laser providing 10.6 $\mu$m radiation. It should be noted that the lithium niobate can be doped with lithium, yttrium, chromium, scandium, tantalum, and neodymium.

A seed (not shown) of ferroelectric crystalline material is then withdrawn from the melt as fresh source material is supplied by advancing the rod 12 into the melt. The square root of the ratio of the pull rate of the crystal to the feed rate of the rod 12 determines the average diameter of the growing ferroelectric crystalline rod, represented by the reference numeral 14. Note that the freezing interface represented at 16 is, in general, curved. This curvature indicates the existence of radial temperature gradients which affect the steady-state domain structure of the growing crystal.

As described to this point, the method steps of the invention are essentially the same as the comparable steps in LHPG. In LHPG of lithium niobate rods, crystals pulled along the z or c crystal axis grow naturally single-domain with the spontaneous polarization vector pointing toward the melt, whereas x-axis (also called a-axis) crystals grow with a domain wall down the middle, and the spontaneous polarization vectors pointing outward (toward±c; the polarization can only point in one of these two directions). These domain structures might be explained by a thermoelectric model, taking into account the symmetry of the temperature gradients. Note, however, that many effects with a symmetry tied to the interface shape could be invoked to explain domain structures with this symmetry.

Composition gradients in the crystalline rod of proper sign and sufficient magnitude can overcome the steady-state poling fields and produce reversed domains. In accordance with the invention, fluctuations in the microscopic (meaning localized right at the interface) growth rate are used to form serially related regions of different composition gradients in the growth crystal, having different polarities. Oppositely-signed composition transients are obtained when the segregation coefficient k of the component or dopant in the source rod is less than, versus greater than, unity. Larger composition transients are obtained for larger changes in growth rate and when k is farther from unity.

There are many conceivable ways to modulate growth rate. Two techniques which have been demonstrated successfully are described here. Both techniques involve moving the freezing interface along the growth axis during growth. The average growth rate is, of course, the pull rate. While the interface is moving opposite the pull direction, the pull velocity and the velocity of motion of the interface add to make the growth rate greater than the pull rate. Similarly, while the freezing interface moves along the pull direction, the effective growth rate is less than the pull rate (and can in fact be negative if remelting occurs). When this movement is modulated, the spatial period $\Lambda$ of the domain structure in the crystalline rod in $\mu$m will be given by $\Lambda = V_{pull}/f_{mod}$, where $V_{pull}$ is the crystal pull rate in $\mu$m/s and $f_{mod}$ is the frequency of modulation in Hz.

In the modulated-heat input approach, the heating laser beam power is modulated. FIGS. 1A through 1C are time sequence "snapshots" illustrating the formation of a single reversed domain in a crystal being pulled along the Z axis. When the seed is withdrawn from the molten zone, a crystalline rod 14 is formed from the melt, which rod, if formed with a constant rate of growth, would naturally have a dominant ferroelectric polarity in the direction represented by the arrow 17.

As illustrated in FIG. 1A, a concentration of dopant or other component in the melt accumulates in a boundary layer at the freezing interface 16. This accumulation is schematically depicted in the drawings by an increased density of dots. While this increase in density is generally continuous into the melt, a "boundary layer" line 19 is included in the drawing to facilitate description.

The time sequence represented by FIGS. 1A-1C illustrate the development of a single reverse domain when the segregation coefficient k in the molten volume has a value of less than 1. If the segregation coefficient was greater than 1, the boundary layer would consist of depletion, rather than an accumulation, of the dopant or other component responsible for the reverse domain.

When the input heat to the molten zone is lowered in intensity, the molten zone cools and reduces in volume so that the freezing interface moves downward relative to the pull direction. (The interface between the molten material and the source rod, represented in FIG. 1 at 21, moves upward.) This downward movement of the freezing interface results in the composition accumulation at the interface being "captured" in a region of the rod being formed. This results in a composition gradient being formed in the rod. As long as this composition gradient tends to produce poling of a sign which is the opposite of the polarity of the region of the rod being grown during the snapshot depicted by FIG. 1A and the magnitude of the poling action due to the composition gradient is sufficient to overcome the natural poling action associated with the growth of the rod, this region will have a dominant polarity which is reversed relative to the polarity with which the rod would naturally grow. As one feature of the instant invention, this region is passed through the Curie isotherm represented at 22 before the magnitude of such composition gradient can be reduced by diffusion within the rod to a level which will not be sufficient to overcome the natural poling action.

FIG. 1C illustrates the arrangement when heat input again increases the molten volume at the tip of the source rod and the freezing interface moves in the direction of pull. The result is that the growth rate is decreased and the boundary layer is not captured in the rod. (It should be noted that there could be "back melting" at this time, i.e., melting of a portion of the rod being grown.) Thus, a region is formed adjacent the region having the reversed dominant ferroelectric polarity, having the natural polarity occurring during steady state growth. (It should be noted that in a modulation arrangement such as being described, this second reversal of polarity could be created by upward motion of the freezing interface, whether or not a natural tendency to this polarity exists in steady state. Thus, sequential regions of differing dominant polarities are formed in the rod. These regions are schematically represented in the rod in FIGS. 1B and 1C.

It will be recognized that the serially related regions of different dominant polarity can be either periodic or aperiodic. That is, if the modulation is periodic and the pull rate is constant, the ferroelectric domain structure of the body will also be periodic. On the other hand, if the growth rate is aperiodic, the resulting domain structure will also be aperiodic.

FIG. 2 provides idealized graphical representations of the input heating power provided to the molten zone versus time, and the resulting growth and melt characteristics. FIG. 2A illustrates the laser heat input. It goes from the value P (the solid line) to a different level shown as zero in the figure. Although there are many ways of providing a rapid heat input change, one used with the instant invention is to provide a shutter for the heating beam which intercepts the same and prevents it from impinging on the tip of the source rod. It will be recognized that this provides a discontinuity in the thermal energy being directed to the tip. The beam is so shuttered for a relatively short duration, e.g., on the order of milliseconds to tens of milliseconds, so as to reduce momentarily the heat input but not completely halt the crystal growth process.

The graphical representation of FIG. 2B illustrates the resulting interface position. Its position moves toward the unmelted source rod at a relatively constant rate during the time the heating beam is shuttered. The direction of the same then reverses once the heat is again allowed to reach the molten zone.

FIG. 2C illustrates the growth rate caused by the modulation. The growth rate increases as illustrated when the heat input is shuttered. When the heat input is again allowed to reach the molten zone, the growth rate decreases to below the pull rate. As the melt reaches its "steady-state" volume, the growth rate again will equal the pull rate. (It will be recognized, of course, that at high repetition rates the growth rate will equal the pull rate only instantaneously.)

Changes in the composition of the material incorporated into the crystalline rod are represented in FIG. 2D. As illustrated, for a segregation coefficient less than one when the growth rate is increased, the dopant or other component concentration incorporated into the crystalline rod will increase. It will decrease dramatically when such growth rate is decreased as illustrated. When the growth rate again approximates the pull rate, the concentration of the dopant or other component in the crystalline rod will approach the concentration which would be achieved if there were no growth rate modulation. In this connection, it should be noted that while FIGS. 2A-2C illustrate two cycles, FIG. 2D only illustrates one.

FIG. 2E illustrates the concentration gradient when the segregation coefficient is less than one. Only that portion of the concentration gradient which provides a poling action sufficiently strong to overcome the natural poling action provides domain reversal. It will be seen that FIG. 2E is similar to FIG. 2D in that it illustrates a single cycle, rather than two cycles. (The concentration of FIG. 2D and 2O the gradient of 2E are those associated with a segregation coefficient of less than 1—the curves would be inverted for an arrangement in which the segregation coefficient is greater than 1.)

Figure 3:
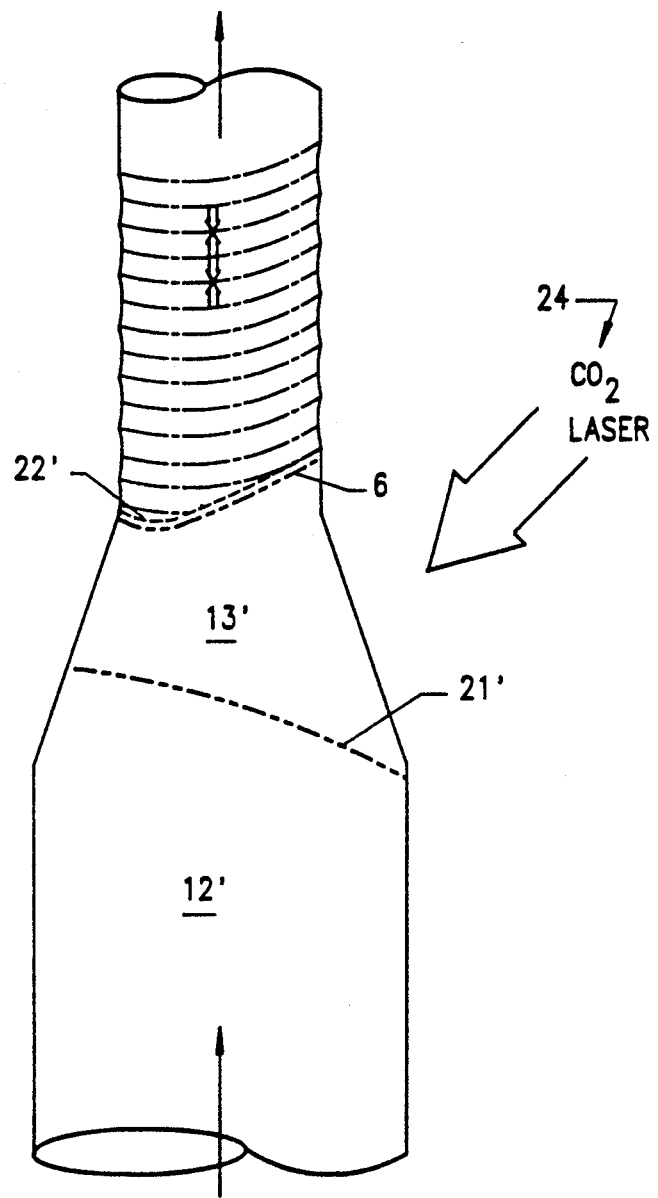
FIG. 3 is a schematic illustration of a laser-heated pedestal growth arrangement depicting an alternate method of modulating heat input.

Another technique for growth rate modulation is the rotating-heat method illustrated schematically in FIG. 3. In this technique, the symmetry of the heating laser beam is intentionally destroyed with, for example, a rotating mask, so that more heat input to the melt comes from one side of the melt. Then, during growth, the heating pattern is rotated about the growing crystal axis, relative to the seed crystal orientation. (It is possible to rotate just the laser input, just the seed, or both at the same time.)

With reference to FIG. 3, the direction from which the laser heat input is greater is represented at 24. The domains which will be created will generally be two interleaved spirals having a pitch determined by the relative rotational rate. The thickness of each spiral corresponds to one complete revolution of the rod relative to the heating beam. The period of the domains is the ratio of the pull rate to such relative rotation rate. In other words, the period ($\lambda$ in micrometers) is equal to the pull rate (micrometers per second) over the rotation rate (revolutions/second). In general, this technique is more effective at faster growth rates, e.g., 2 millimeters per minute.) Parts of this arrangement which correspond to the arrangement described above in connection with FIGS. 1A-1C, are referred to by the same numerals, primed.

The large axial temperature gradients provided by the use of laser heating with optical radiation are important. These large temperature gradients prevent erasure of composition gradients by diffusion before the domains are "locked in" by passing downward in temperature through the Curie isotherm and by spatially locating the Curie isotherm so that its distance from the melt is short. The fact that the Curie temperature is near the melting temperature of lithium niobate also helps by putting the Curie isotherm closer to the freezing interface, where temperature gradients are naturally higher. The rapid growth rates possible with this process as opposed to Czochralski and Stepanov crystal growth methods also help in this "freezing-in" of composition gradients and domain structure.

In addition to the large axial (along the pull direction) temperature gradients, the fast thermal time constants of the small molten zone (i.e., it can be heated and cooled quickly) and the capability of growing at high pull rates (because of the large axial gradients and small diameter of crystals) contribute to the ability to grow domains reversed with high spatial frequency along the length of the growing crystal. Note that it is possible to grow crystals in atmospheres with different thermal transport properties (e.g. He-rich for greater heat transfer away from the growing crystal) in order to alter the temperature gradients and thermal time constants. Because of the advantages of this method, domain-reversed structures have been created in undoped $LiNbO_3$ of near-congruent composition, a feat which has not been demonstrated, to the knowledge of the inventors, using any other growth technique.

The invention also includes a method for clarifying crystalline material, i.e., increasing its transparency to optical radiation of interest, without erasing reverse domain polarities. To this end, the invention includes applying heat to the solid state body while maintaining the same in an oxidizing atmosphere and satisfying a certain relationship.

It is necessary during the heating for optical clarification that the body not reach its Curie temperature. Most desirably, the body is maintained at a temperature during heating which is significantly below the Curie temperature. It will be recognized that heating a body significantly below its Curie temperature can result in requiring heating for a significant period of time. Such heating will not result in destruction of the reversed polarity domains if significant diffusion of the components responsible for defining the ferroelectric polarity is avoided. This can be assured by diffusion at a temperature and time such that:

$$\sqrt{D_p t} << L$$

where $D_p$ diffusion coefficient of the dopant or component in the solid base material which is responsible for defining the direction of ferroelectric polarity;

ti = of heating; and

L = distance over which dopant or component must diffuse to wash out the modulated domain structure (e.g. for a periodic structure, L is equal to one-half the period).

If the base material is lithium niobate doped with magnesium to a concentration of about 5% atomic weight, it has been found that the domain structure is not destroyed if a solid state body approximately 250 micrometers in diameter is maintained in oxygen at a temperature of between about 700° and 800° for about three hours. The resulting structure, though, is clarified for optical radiation approximately 0.80 micrometers wavelength and about 0.40 micrometers in wavelength.

EXAMPLE

A ferroelectric crystalline rod of Mg-doped (5% atomic weight) a-axis $LiNbO_3$ crystal was grown having a diameter of approximately 250 μm. It was grown at a pull rate $v_{pull}=2$ mm/min. The heat input was modulated using a periodically-triggered electromechanical shutter with $f_{mod}=12.35$ Hz, resulting in a domain structure of period $\Lambda=2.7$ μm. This period was selected so that second harmonic generation using either the $d_{33}$ or $d_{22}$ nonlinear coefficient could be first-order quasi-phase-matched within the wavelength tuning range of a cw Styryl-9 dye laser. The grown rod was clarified in flowing dry $O_2$ by subjecting the same to heat for 3 h at 725° C. This increased the crystal transparency without erasing the periodic domain structure.

Although the invention was specifically motivated by the application of the resulting material to quasi-phase-matched second harmonic generation of blue light using GaAlAs laser diodes, the material resulting from the method of the invention can generally be applied to a great variety of nonlinear optical frequency conversion and measurement techniques. Processes involving the second-order nonlinear optical susceptibility include second harmonic generation, optical parametric oscillators and amplifiers, parametric fluorescent sources, and sum- and difference-frequency generation. In any nonlinear optical interaction, one can tune either the wavelength, temperature, or angle of propagation through the crystal to achieve phase-matching. The acceptance bandwidths for optical processes depend on which nonlinear coefficients (and hence refractive indices) are being used. Quasi-phase-matched interactions may have intrinsically wider acceptance bandwidths, for example, when $d_{33}$ or $d_{22}$ are used instead of the birefringently phase-matchable $d_{31}$. It may also be desirable in some situations to use noncollinear phase-matching schemes, with the wave vector of the poling not, in general, parallel to any of the optical wave vectors, to get a large angular (or other) acceptance bandwidth.

Besides frequency conversion, measurement techniques such as autocorrelation of short optical pulses using second harmonic generation may benefit from the altering of phase-matching conditions. The group-velocity dispersion characteristics of domain-reversed material should be similar to that of uniformly-poled material, giving it a similar response to short pulses.

It should be noted that the usefulness of the domain-reversed material is not limited to periodic structures. Spread-spectrum techniques can be applied to nonlinear optical interactions: it has been suggested that aperiodic structures of the proper design can be used to broaden the phase-matching bandwidth of an interaction without proportionally reducing the conversion efficiency.

A special case of second-order nonlinear interaction occurs when optical waves interact with electromagnetic waves of much lower frequency. This is called the electro-optic effect. Phase-matching using periodic or aperiodic domain reversals can also be applied to traveling-wave electro-optic modulators or perhaps to novel frequency shifters. It has been noted that electro-optic modulators based on the principle of diffraction of light from the periodic structure (analogous to acousto-optic modulators) do not exhibit a direct relationship between the size of the "optical window" and the effective response time of the modulator. Thus high-speed bulk modulators using this principle may be feasible in periodically-polled material.

The photorefractive effect generally limits the use of $LiNbO_3$ at visible wavelengths because it causes scattering of light beams traveling through the crystal. The reduced photorefractive sensitivity of material having domains reversed with high spatial frequency makes it especially attractive for optical devices involving visible light. This property may be used by itself or in combination with other altered optical properties of the material.

The piezoelectric, acoustic, and pyroelectric properties of the material also have potential applications. For example, high-frequency acoustic bulk-wave transducers and surface acoustic wave reflectors can be made in the material, as well as bending or twisting vibrators or actuators, and novel resonators. These properties may also be used in combination, for example in using a heat pulse to excite a specific acoustic vibration though the pyroelectric effect.

Properties arising from the presence of reversed domains can also be combined with other techniques to enhance device performance. One example is the fabrication of optical or acoustic waveguides in the material to confine these interactions. For example, proton exchange could be used to clad the ordinary index of $LiNbO_3$ fibers for quasi-phase-matched SHG using the $d_{22}$ nonlinear coefficient, or to raise the extraordinary index to make an integrated-optic waveguide in periodically-poled material for using the $d_{33}$ coefficient. Proton exchange is a promising waveguide fabrication technique for use with this material since it occurs at low temperatures which are unlikely to disturb the grown-in domain structures. A final example is the fabrication of resonators in periodically-poled material for the enhancement of frequency conversion efficiencies, such as described in U.S. patent application Ser. No. 209,528 filed Jun. 21, 1988 entitled EFFICIENT LASER HARMONIC GENERATION EMPLOYING A LOW-LOSS EXTERNAL OPTICAL RESONATOR.

Although the invention has been described in connection with preferred embodiments thereof, it will be appreciated by those skilled in the art that various changes and modifications can be made without departing from its spirit. It is therefore intended that the coverage accorded applicants be defined only by the claims and their equivalents.

What is claimed is:

1. In a method of clarifying a solid body of crystalline material having regions defined by a base material and a dopant or component responsible for defining different ferroelectric polarities within the body, the steps of:
   (a) providing a solid body of crystalline material having adjacent regions of different ferroelectric polarities; and
   (b) applying heat to both of said regions while maintaining the same in an oxidizing atmosphere and satisfying the following relationship:

$$\sqrt{D_p t} << L$$

where
   $D_p$ = diffusion coefficient of the dopant or component in the solid base material which is responsible for defining the direction of ferroelectric polarity;
   $t$ = time of heating; and
   $L$ = distance over which said dopant or component must diffuse to wash out the polarity for which it is responsible.

2. The method of claim 1 wherein said base material is lithium niobate and sufficient heat is applied to said regions while said regions are in an oxygen atmosphere, to maintain the same at a temperature of between about 700° and 800° C.

* * * * *